US006958722B1

(12) United States Patent
Janakiraman et al.

(10) Patent No.: US 6,958,722 B1
(45) Date of Patent: Oct. 25, 2005

(54) SAR ADC PROVIDING DIGITAL CODES WITH HIGH ACCURACY AND HIGH THROUGHPUT PERFORMANCE

(75) Inventors: Seetharaman Janakiraman, Bangalore (IN); Vikram Varma, Bangalore (IN); Yujendra Mitikiri, Hyderabad (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/709,996

(22) Filed: Jun. 11, 2004

(51) Int. Cl.[7] ............................................. H03M 1/38
(52) U.S. Cl. ...................................... 341/161; 341/156
(58) Field of Search ................ 341/156, 155, 341/158, 161, 162, 163, 141, 145, 172, 146; 307/240, 241, 243, 246

(56) References Cited

U.S. PATENT DOCUMENTS

| | | | | |
|---|---|---|---|---|
| 5,138,319 A | * | 8/1992 | Tesch | 341/156 |
| 5,534,864 A | * | 7/1996 | Ono et al. | 341/156 |
| 5,638,075 A | * | 6/1997 | Nakajima | 341/163 |
| 6,167,132 A | * | 12/2000 | Krone et al. | 379/399.01 |
| 6,686,864 B1 | * | 2/2004 | Moreland | 341/161 |
| 6,844,840 B1 | * | 1/2005 | Melanson | 341/161 |
| 2003/0123646 A1 | | 7/2003 | Chakravarthy | |

FOREIGN PATENT DOCUMENTS

EP 1341394 * 3/2003 ............ H04R 3/00

* cited by examiner

*Primary Examiner*—Brian Young
(74) *Attorney, Agent, or Firm*—W. Daniel Swayze, Jr.; W. James Brady; Frederick J. Telecky, Jr.

(57) ABSTRACT

An aspect of the invention improves accuracy of digital codes generated at the output of a SAR ADC by using multiple reference voltages. A first reference voltage is used to generate an equivalent voltage corresponding to previous resolved bits and a second reference voltage is used to generate equivalent voltage corresponding to the bits being presently resolved. Another aspect of the present invention provides an ADC with high SNR as well as high throughput performance. Such a feature may be achieved by resolving some of the MSBs of the digital code using a high speed and low SNR DAC and remaining bits of the digital code using a high SNR DAC.

52 Claims, 10 Drawing Sheets

SAR ADC PROVIDING DIGITAL CODES WITH HIGH ACCURACY AND HIGH THROUGHPUT PERFORMANCE

BACKGROUND OF INVENTION

1. Field of the Invention

The present invention relates to analog to digital converters (ADCs), and more specifically to a successive approximation (SAR) ADC operating with both high accuracy and (high) throughput performance.

2. Related Art

Analog to digital converters (ADCs) are used to generate a sequence of digital codes representing the respective signal levels of an analog signal as is well known in the relevant art. In general, an ADC receives a reference voltage also as input, with the voltage indicating the maximum input voltage level.

Assuming the ADC is to generate an N-bit digital code, a digital code ideally equals ($Vin*2^N$/Vref), wherein Vref, Vin, * and / respectively represent the reference voltage, voltage level of a sample of the input signal, multiplication operator and division operator. In addition, a voltage level corresponding to one least significant bit (LSB) equals ($Vref/2^N$).

ADCs often employ successive approximation principle (SAP) for such a conversion. ADCs implemented using SAP are generally referred to as SAR (successive approximation register) ADCs as a register is used to store the codes used to generate an intermediate analog signal.

In a typical SAP based implementation, each bit of a digital code (with the digital code representing a sample of the analog signal) is determined in a single iteration, starting from the most significant bit. To determine the most significant bit, the most significant bit is set to a specific logical value (e.g., 1) and the following bits to the other logical value (0), and the resulting number is converted to an intermediate analog signal (generally using a digital to analog converter (DAC), contained in the ADC).

Assuming the specific logical value equals 1, the value of the most significant bit of the digital code is determined to equal 0 if the sample of the analog signal has less voltage than the intermediate analog signal, or else to 1. The next significant bit may be set to 1 (while setting the most significant bit to the determined value) and the following bits to 0, and the resulting number is used to generate a new intermediate analog signal.

The new intermediate analog signal is compared with the sample of the analog signal to determine the corresponding (next significant) bit of the digital code. The approach is continued until all the bits of the digital code are determined. Other digital codes representing an analog signal may be generated at a desired sampling interval.

Speed of a SAR ADC is typically determined by the time duration to perform each iteration. The time duration depends on several factors. One of such factors is the time taken by a DAC to generate an intermediate analog signal corresponding to the digital code in each iteration. There is a general need to increase speeds (or throughput performance) of ADCs, and accordingly it may be desirable to reduce the time taken to generate an intermediate analog signal corresponding to a digital code.

One challenge presented in such reduction is that the load that needs to be driven by a reference voltage, changes as bits are resolved, and the reference voltage changes transiently due to the changing load. At least when SAR ADCs need to operate at a high throughput performance, only a small time window (duration) may be available to resolve additional bits, and the value of the digital code may deviate from the ideal value depending on the difference of the offered reference voltage from the ideal reference voltage while the bits are resolved.

The degree of change may be different as different bits are being resolved. At least in situations when the change exceeds a threshold voltage equaling the resolution (voltage level equaling one least significant bit value) of the ADC, the output may deviate from an accurate value, and is undesirable.

The problem may be compounded with respect to high resolution ADCs, since the threshold voltage is inversely proportional to the ADC resolution.

Another challenge presented in reduction of time to generate an intermediate analog signal, is that the components used in DAC may need certain time to settle to the voltage level of reference voltage. If the time duration is not enough for the components to settle, the signal level of the intermediate analog signal may not represent the digital code accurately in each iteration. Even in such a situation the output digital code of an ADC may deviate from an ideal (accurate) value.

One approach to ensuring accurate digital codes is to decrease the throughput performance (speed or number of codes generated per second) of operation of an ADC, such that additional time is available for the various voltage levels to settle. Unfortunately, it is often desired to provide high throughput performance. What is therefore required is a SAR ADC, which provides accurate digital codes at high throughput performance.

BRIEF DESCRIPTION OF DRAWINGS

The present invention will be described with reference to the following accompanying drawings.

In the drawings, like reference numbers generally indicate identical, functionally similar, and/or structurally similar

DETAILED DESCRIPTION

1. Overview

An aspect of the present invention provides SAR ADCs which can operate at a high speed (throughput performance) while providing digital codes of high accuracy as well. A first reference voltage is used to generate an equivalent voltage corresponding to previous generated bits and a second reference voltage is used to generate equivalent voltage corresponding to the bits being presently resolved.

Since the first reference voltage is used to generate equivalent voltage corresponding to the resolved bits (which do not change in the same conversion phase), the first reference voltage may not change due to the load offered by a DAC used in the conversion iterations. Accurate digital codes may be generated as a result.

In addition, as the second reference voltage is used to resolve only a portion of the bits (i.e., small number of bits) at any time, the load may not affect the voltage level much. As a result, a next bit can be resolved quickly (without having to allow for substantial settling time), thereby enhancing the throughput performance of ADCs. Thus, ADCs may be implemented with high speed as well as with high accuracy.

Another aspect of the present invention improves signal to noise ratio (SNR) of a high speed SAR ADC by using a high speed DAC in combination with a DAC providing high SNR. SNR generally refers to the ability of an ADC to generate a digital code accurately independent of any noise that may otherwise affect the accuracy. In an embodiment, the high speed DAC resolves the most significant bits (MSBs) in the digital code accurately at a high speed (compared to the DAC with high SNR). The resolved MSBs are used to set the corresponding MSBs of the digital code in the high SNR DAC. The remaining bits of the digital code are generated using the DAC providing high SNR.

By using high speed DACs (which generally operate faster), the overall throughput performance of a SAR ADC is enhanced. By using a high SNR DAC to resolve the LSBs, the SNR of the ADC may also be enhanced. Thus, high speed ADCs providing high SNR as well as accurate digital code may be provided according to several aspects of the present invention.

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
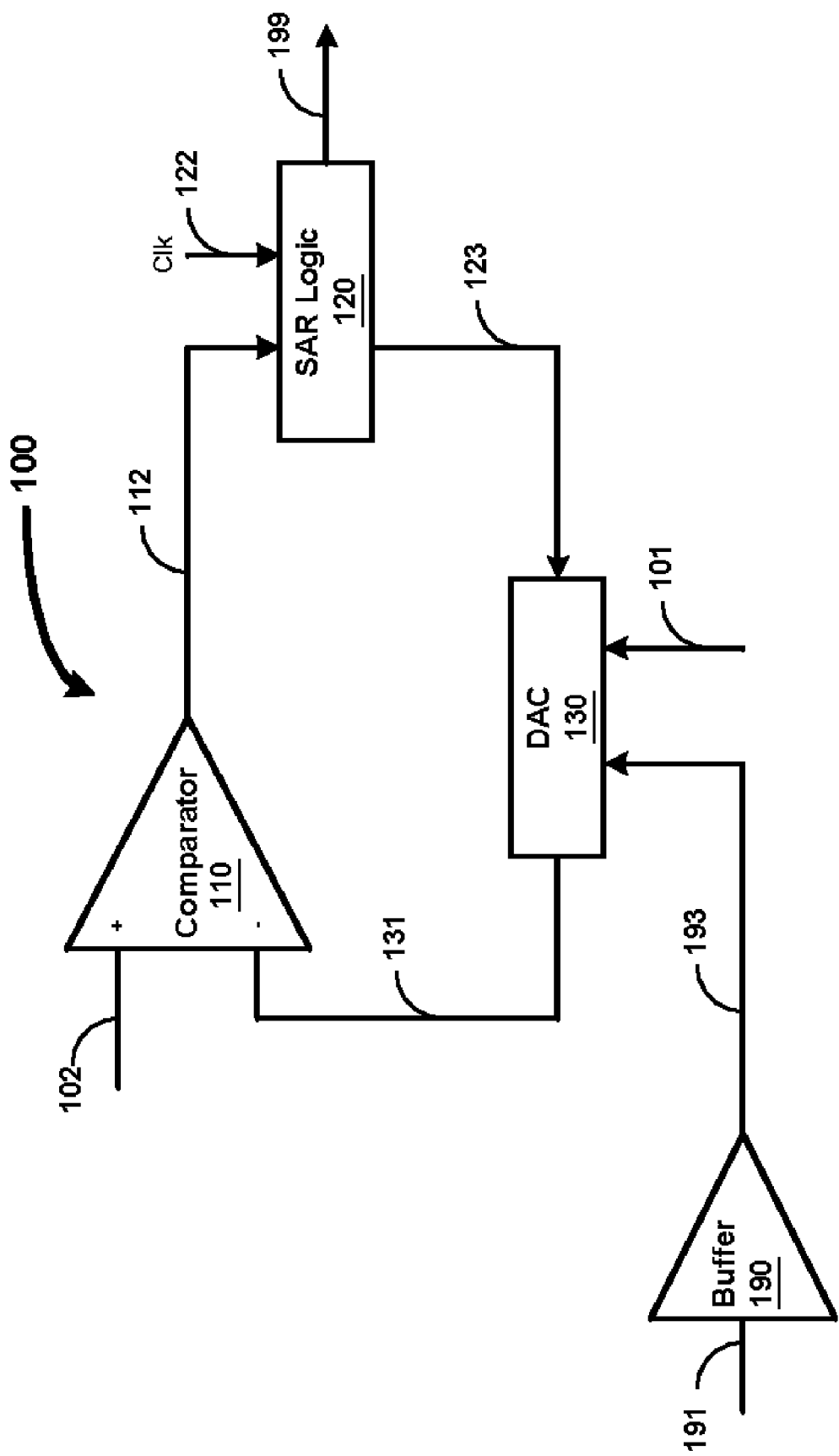
FIG. 1 is a block diagram illustrating the details of an example embodiment of a successive approximation analog to digital converter (SAR ADC).

FIG. 1 is a block diagram illustrating the details of an example prior embodiment of ADC 100, which can be improved according to several aspects of the present invention. SAR ADC 100 is shown containing comparator 110, SAR logic 120, digital to analog converter (DAC) 130, and buffer 190. Each component is described in detail below.

Comparator 110 compares an intermediate analog signal received on path 131 with a voltage level Vmid (equaling Vdd/2 in an example embodiment, wherein Vdd represents a supply voltage) on path 102, and provides the result of the comparison (iteration status) on path 112. In an embodiment, the result equals a logical value '1' if a sample of an analog signal on path 101 is greater than the signal value corresponding to the intermediate digital value (described below), else the result equals a logical value of '0'. Comparator 110 can be implemented in known way.

SAR logic 120 determines the digital code corresponding to a sample (provided on path 101) using successive approximation principle by interfacing with comparator 110 and DAC 130. In general, SAR logic 120 sends an intermediate digital value during each iteration to determine a bit, and generates the digital code based on the determined bits. The digital code is provided on path 199. Clock 122 controls the duration of each iteration. In an embodiment, clock 122 operates with different durations in different iterations as described in further detail in sections below.

DAC 130 samples the analog signal received on path 101 before the first iteration during conversion. DAC 130 then generates intermediate analog signal 131 having a voltage level equaling (Vmid__Vinp+a voltage level corresponding to an intermediate digital value received on path 123) in each iteration (in which a bit of the digital code is determined), wherein Vinp represents the voltage level of the sampled analog signal.

The voltage level corresponding to intermediate digital value is generated using a reference voltage received on path 193. For example, assuming that the intermediate digital value (on path 123) equals Q and reference voltage 193 equals Vref, then the voltage level corresponding to the digital value equals $(Vref*Q)/2^N$, wherein N represents the number of bits in the digital code generated by the ADC.

Buffer 190 generates reference voltage 193 from an external voltage received on path 191. In general, reference voltage 193 needs to be at a constant predetermined level during all the iterations for the digital code to be generated accurately. The reference voltage may not be at such a level for reasons noted above in the background section. As a result, the digital code may not be generated accurately.

An aspect of the present invention enables the digital code to be determined accurately at a high speed. Such a feature is achieved by implementing DAC 130 consistent with the principles underlying various aspects of the present invention. The principles may become clearer by understanding operation of the DAC in example prior embodiments. Accordingly, the operation of prior DAC is described first with reference to FIGS. 2A and 2B.

3. Prior DAC

Figure 2A:
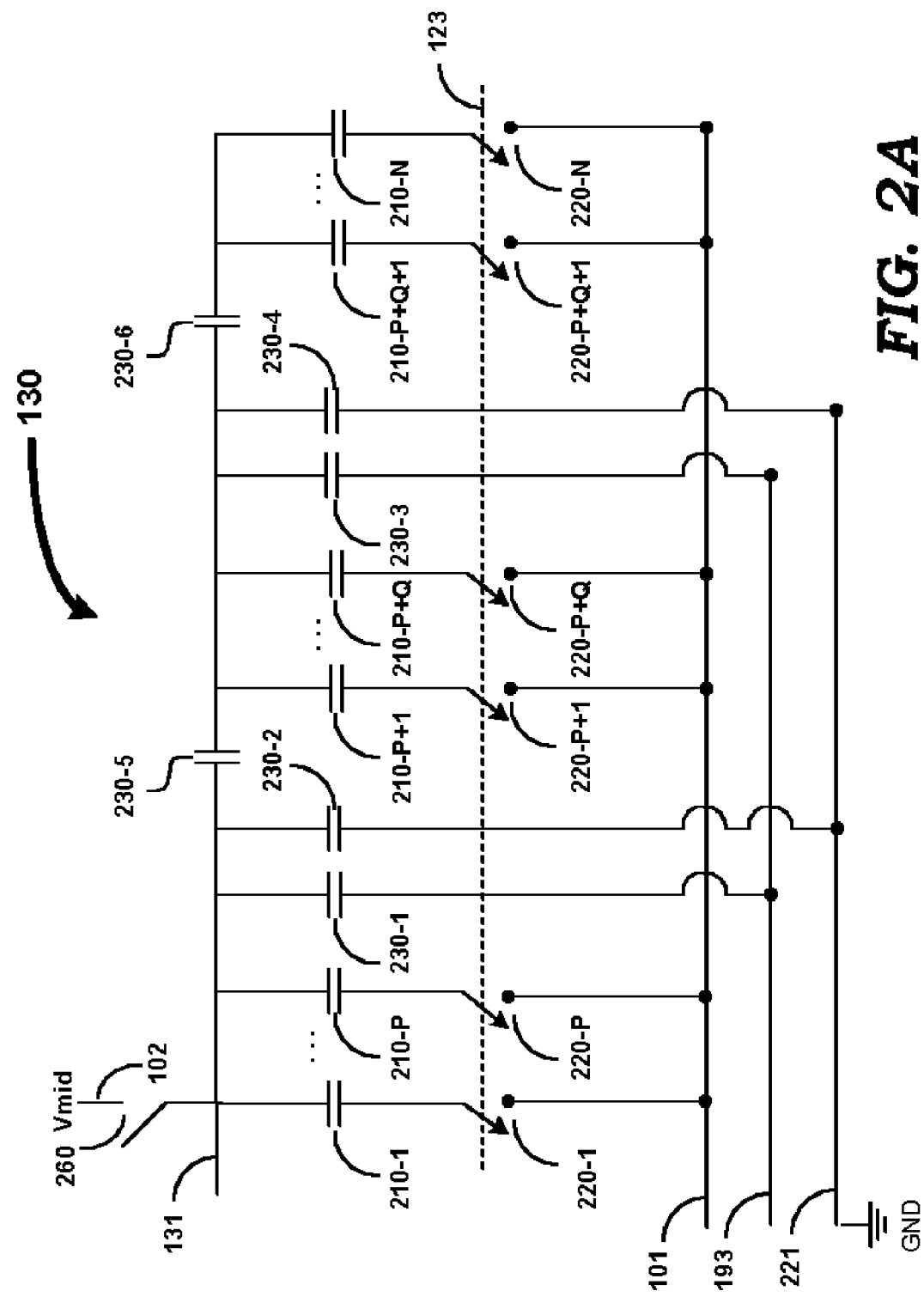
FIG. 2A is a circuit diagram illustrating the details of operation of a digital to analog converter (DAC) in a sampling phase in one prior embodiment.
Figure 2B:
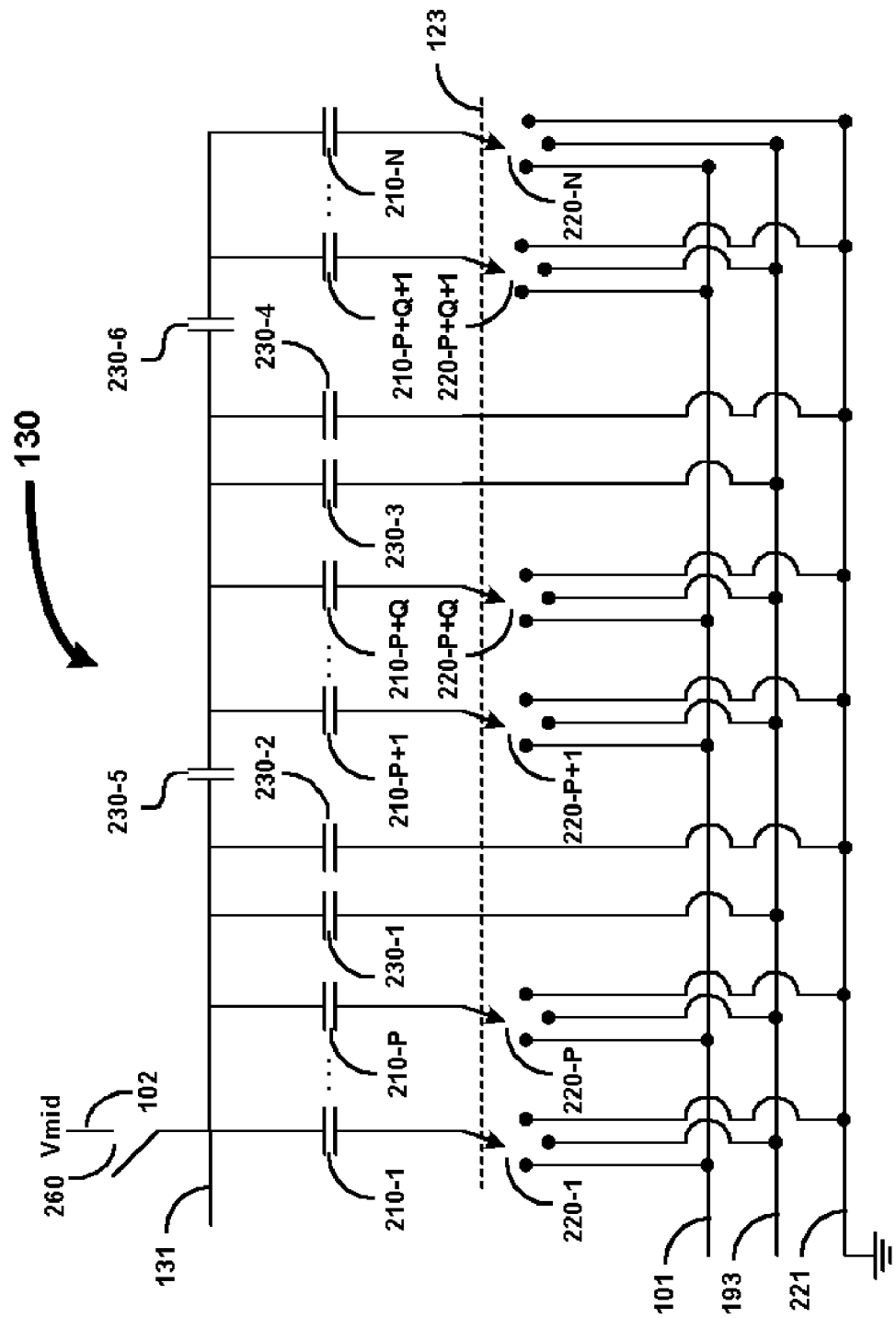
FIG. 2B is a circuit diagram illustrating the details of a DAC in a conversion phase in one prior embodiment.

FIGS. 2A and 2B are circuit diagrams illustrating the details of DAC 130 (illustrated with reference to paths 101, 193, 123 and 131) in sampling phase and conversion phase respectively in one prior embodiment. As is well known, the input signal (on path 101) is sampled in the sampling phase, and the sample is converted into a digital code in multiple iterations (with one bit determined in each iteration) of the conversion phase.

Continuing with reference to FIG. 2A, DAC 130 is shown containing capacitors 210\_1 through 210\_N and 230\_1 through 230\_6, and switches 220\_1 through 220\_N and 260. One end of all the capacitors (top plate) is coupled to Vmid on path 102. The other end (bottom plate) of capacitors 210\_1 through 210\_N is connected to a sample of analog signal on path 101 by a corresponding switch. The other end of capacitors 230_1 and 230_3 is connected to Vref 193, and of capacitors 230_2 and 230_4 is connected to ground. The operation of capacitors 210_1 through 210_N and 230_1 through 230_4 in sampling phase is described below and the operation of capacitors 210_1 through 210_N and 230_1 through 230_6 is described in conversion phase with reference to FIG. 2B.

Switches 220_1 through 220_N and 260 are closed in the sampling phase, causing the analog signal on path 101 to be sampled on capacitors 210_1 through 210_N. Each capacitor 210_1 through 210_N charges through sample 101 and Vmid 102. Each of capacitors 230_1 and 230_3 charges through Vref 193 and Vmid 102, and each of capacitors 230_2 and 230_4 charges through Vmid 102 and ground. The voltage corresponding to total charge due to all capacitors is provided on path 131. Capacitors 210_1 through 210_N, 230_5 and 230_6 together resolve N_bit digital code in conversion phase and capacitors 230_1 through 230_4 together correct error in the resolved bits of N_bit digital code, as described below in further detail with reference to FIG. 2B.

FIG. 2B is a circuit diagram illustrating the details of the DAC (of FIG. 2A) in the conversion phase. In an embodiment, high speed SAR ADC may be implemented by resolving some bits of the N-bit digital code at a high speed and remaining bits at a low speed by using a combination of high speed and low speed clock pulses contained in clock signal 122.

Assuming that the N-bit digital code is divided into (P+Q+R)bits, then the first P-MSBs of N-bit digital code are resolved at a high speed by providing a high speed clock signal on path 122 since MSBs may not be required to be accurate and can be resolved at high speed. The next Q-MSBs of the N-bit digital code are resolved at a speed less than that of the first P-MSBs. The remaining R-bits are resolved at a low speed by receiving a low speed clock signal on path 122.

Briefly, during conversion phase, capacitors 210-1 through 210-P are operational while resolving the P-bits, capacitors 210-P+1 through 210-P+Q are operational while resolving the Q-bits, and capacitors 210-P+Q+1 through 210-N are operational while resolving the remaining R-bits in the N-bit digital code. Capacitors 230-1 through 230-4 corrects the error in the resolved bits.

Capacitors 230-5 and 230-6 facilitate the selection of capacitance values of capacitors 210-1 through 210-N to be practically feasible values if N is a large number as described in further detail below.

In an embodiment, the effective capacitances of capacitors at positions 210_1 through 210_N need to respectively equal C, C/2, C/4, etc. to generate the intermediate analog signal in increments of binary weight (of voltage) in each iteration as required for a SAR operation. In such an embodiment, the lowest capacitance required is $C/2^N$. In practice, realizing such capacitors with such a low capacitance may provide substantial challenges if N is a large number. Series capacitors 230-5 through 230-6 are used to avoid the requirement of such low capacitance value as described below.

Capacitor 230-5 is connected in series between the P-set of capacitors (210-1 through 210-P) and Q-set of capacitors (210-P+1 through 210-P+Q). The capacitance value of capacitor 230-5 is chosen such that the effective capacitance of capacitor 230-5 and the first capacitor 210-P+1 in the Q-set of capacitors equals half that of 210-P, as desired. In an embodiment, the capacitance value of capacitor 210-P+1 equals C and the remaining capacitance values of capacitors in the Q-set of capacitors equal C/2, C/4 ... $C/2^Q$ to provide effective binary weighted voltage. As a result, capacitors with low capacitance may not be required since Q is less than N.

The description is continued below with reference to the manner in which capacitors 210-1 through 210-N and 230-1 through 230-6 operate to generate an intermediate voltage in binary weighted format.

During the conversion phase, switch 260 is opened to force the total charge on top plates of all capacitors to remain the same (equal to) as in the sampling phase. The bottom plates of capacitors 210-1 through 210-N are either connected to Vref on path 193 or ground on path 221 by respective switches 220_1 through 220_N based on the corresponding bits of intermediate digital value 123.

While resolving the first P-MSBs, intermediate digital value 123 represents the digital value corresponding to the P-bits, and switches 220-1 through 220-P are controlled by the P-bits in the intermediate digital value to connect capacitors 210-1 through 210-P to either Vref or ground. For example, assuming P equals 6 (intermediate digital value corresponding to the P-bits starting from MSB equals '101000'), switches 220-1 and 220-3 are connected to Vref 193 and the remaining switches are connected to ground.

If the voltage on bottom plates of the capacitors is changed, the voltage on top plates would also change in a similar manner to maintain the same charge. Due to the operation of switches 220_1 through 220_P, the voltage on bottom plates of the capacitors is controlled by the intermediate digital value on path 123. Therefore, a change in intermediate digital value causes a similar change in the voltage at top plates (Vtop) on path 131. As a result, DAC provides the intermediate analog signal on path 131 with a voltage level in the form of binary weighted increments due to the selection of binary weighted capacitances for the capacitors in the above example embodiment.

SAR logic 120 uses the comparison result of the voltage on path 131 with a voltage on path 102, and determines the corresponding bit in the N-bit digital code in each iteration. As may be noted that, intermediate voltage (voltage level of intermediate analog signal 131) on path 131 may not equal exactly to the voltage on path 102 even after resolving the P-bits, and the difference may be viewed as an error. The P-bit digital code may need to be corrected if the error is more than the resolution of the ADC. The manner in which such correction may be performed is described below with reference to capacitors 230-1 and 230-2.

Once the first P-bits are resolved, capacitors 230-1 and 230-2 correct the error in the P-bit digital code in negative and positive directions respectively. As capacitors 230-1 and 230-2 are connected to respective voltages Vref 193 and ground 221 during both sampling and conversion phases, the voltage corresponding to the capacitors may not affect the resolved bits. If the comparison result indicates that the intermediate voltage is greater than voltage 102, then the error will be corrected in negative direction by connecting capacitor 230-1 to ground. As a result, the intermediate voltage level may be reduced.

Similarly, if the comparison result indicates the intermediate voltage is less than voltage 102, then the error will be corrected in positive direction by connecting capacitor 230-2 to Vref 193. As a result, the intermediate voltage will be increased to correct the error in the positive direction.

After resolving the P-bits and correcting the error, the residue voltage is used to resolve the next Q-bits and next the remaining R-bits in a similar manner. Capacitors 230-3 and 230-4 are used similar to capacitors 230-1 and 230-2 respectively to correct the error in the Q-bits. In an embodiment, the capacitance of each of capacitors 230-1 and 230-2 is selected equaling the capacitance of capacitor 210-P, and the capacitance of each of capacitors 230-3 and 230-4 is selected equaling the capacitance of capacitor 210-P+Q. The problems with such a prior DAC are described below.

4. Problems with the Prior DAC

One problem with the prior DAC described with respect to FIGS. 2A and 2B is the capacitance load offered on buffer 190 by switching the connections of capacitors 210-1 through 210-N changes based on intermediate digital value on path 123. After resolving the P-bits, the capacitance load increases while resolving the next Q-bits since the capacitance value of capacitor 210-P+1 is chosen to be a large value ('C'), which causes a correspondingly high change in the voltage level of Vref 193. Vref 193 needs to be at least N-bit accurate (i.e., the change in Vref 193 can be with in the range of $Vref/2^N$) to generate an accurate N-bit digital code. Thus, Vref 193 needs to be (P+Q) bits accurate while resolving the Q-bits and N-bits accurate while resolving the remaining R-bits in the N-bit digital code.

However, switching the large capacitance ('C') to Vref 193 according to intermediate digital value, may cause a large change in Vref 193, which causes an error in the intermediate voltage on path 131. As a result, the N-bit digital code at the output may not be accurate.

In addition, the accuracy may be adversely impacted due to the settling requirement of large capacitors in DAC. As the capacitance of capacitors (for example, of 210-1, 210-(P+1), etc.) is large, then such capacitors will require long time to settle to the voltage level of Vref 193 in the desired time duration (less than one clock cycle of clock 122). As a result, the intermediate voltage on path 131 may not be accurate, which may cause inaccuracy in the digital code at the output of a SAR ADC. Several aspects of the present invention increase the accuracy of the output digital code while resolving the bits at a high speed as described below in further detail with reference to FIG. 3.

5. SAR ADC

Figure 3:
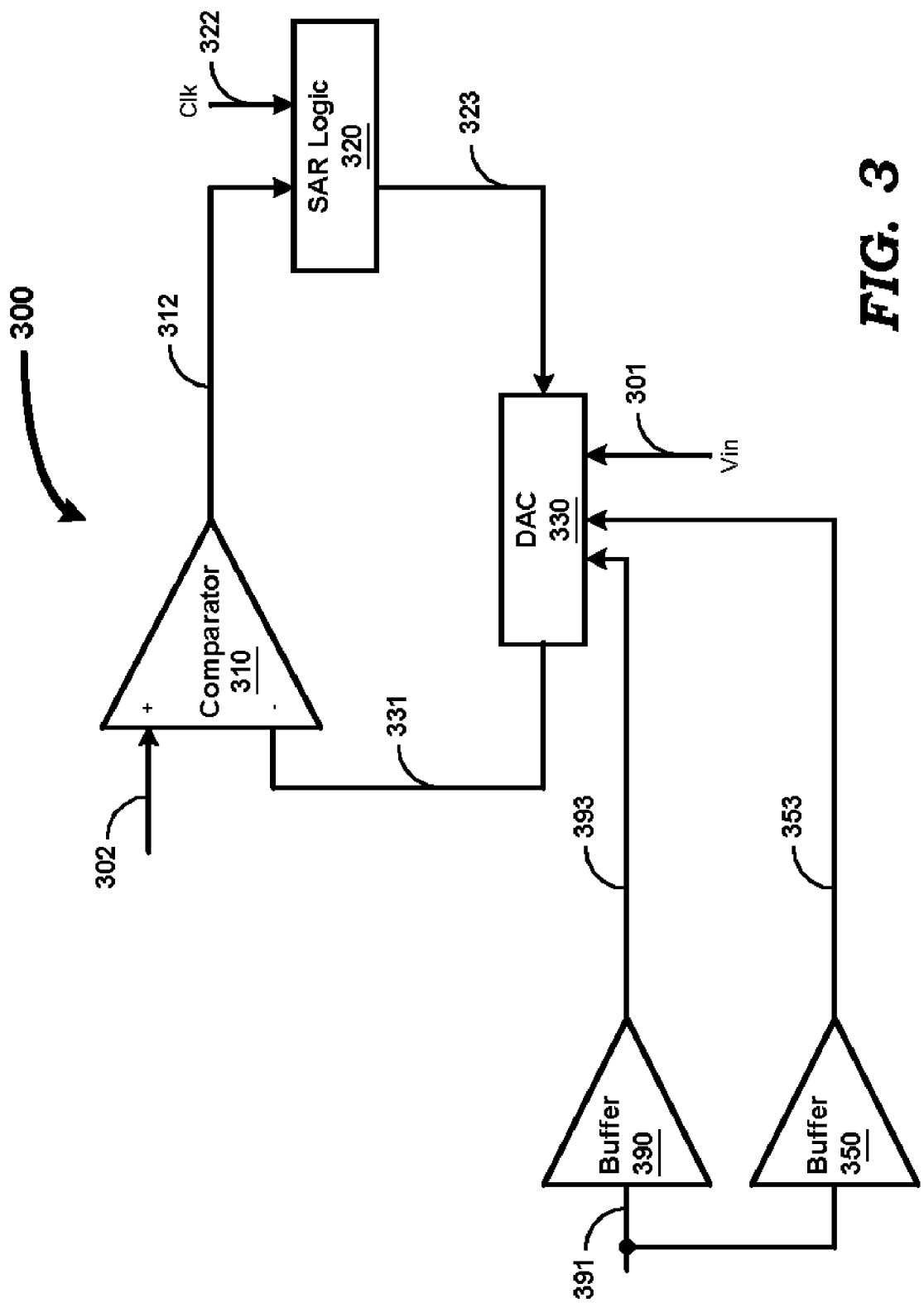
FIG. 3 is a block diagram illustrating the details of a SAR ADC according to an aspect of the present invention.

FIG. 3 is a block diagram illustrating the details of SAR ADC 300 according to an aspect of the present invention. SAR ADC 300 is shown containing comparator 310, SAR logic 320, digital to analog converter (DAC) 330, and buffers 390 and 350. In the embodiment(s) of FIG. 3, buffers 390 and 350 are shown contained in SAR ADC 300. However, in alternative embodiments, buffers 390 and 350 are provided external to SAR ADC 300. Each component is described in detail below.

Paths 301, 302, 312, 322, 323, 331 and 393 operate similar to paths 101, 102, 112, 122, 123, 131 and 193 of FIG. 1 respectively. Briefly, path 301 receives an analog signal to be sampled and converted into an N-bit digital code. Path 302 receives Vmid voltage as described above with reference to FIG. 1. Path 312 contains a comparison result of intermediate analog signal on path 331 and Vmid 302. Path 323 contains intermediate digital value 323 generated in each iteration of conversion phase. Path 393 contains a reference voltage and path 353 contains another reference voltage.

Comparator 310, SAR logic 320 and buffer 390 respectively operate similar to comparator 110, SAR logic 120 and buffer 190 of FIG. 1. The remaining components of FIG. 3 are described below.

Each of buffers 350 and 390 generates reference voltage Vref on paths 353 and 393 respectively. The reference voltages thus generated are used to generate N-bit digital codes accurately and with high throughput rate (speed) as described below.

DAC 330 generates an intermediate analog signal (on path 331) corresponding to intermediate digital value 323 using both reference voltages 353 and 393. As the load caused by DAC 330 is distributed across multiple reference voltages, each reference voltage may be less susceptible to changes due to the load imposed by operation of DAC 330. In an embodiment described below, one reference voltage is used to operate the portions corresponding to the resolved bits, and another reference voltage is used to operate the portions corresponding to the bits presently being resolved. Digital codes may be generated accurately as a result.

The implementation of DAC may need to be implemented taking into account various other design considerations as well. In an example implementation described below, the accuracy of digital code depends on the two reference voltages 353 and 393 being substantially equal. For example, the difference of the two voltages may need to be (N−P) bit accurate to generate an accurate N-bit digital code.

Implementing buffers, which generate such substantially equal voltages may be challenging for reasons such as variation in the inherent characteristics of the components used in buffers 390 and 350, etc. An aspect of the present invention enables DAC 330 to generate accurate N-bit digital codes, while operating with reference voltages which potentially deviate by more than (N−P) bit LSB equivalent voltage, as described below.

6. Method

Figure 4:
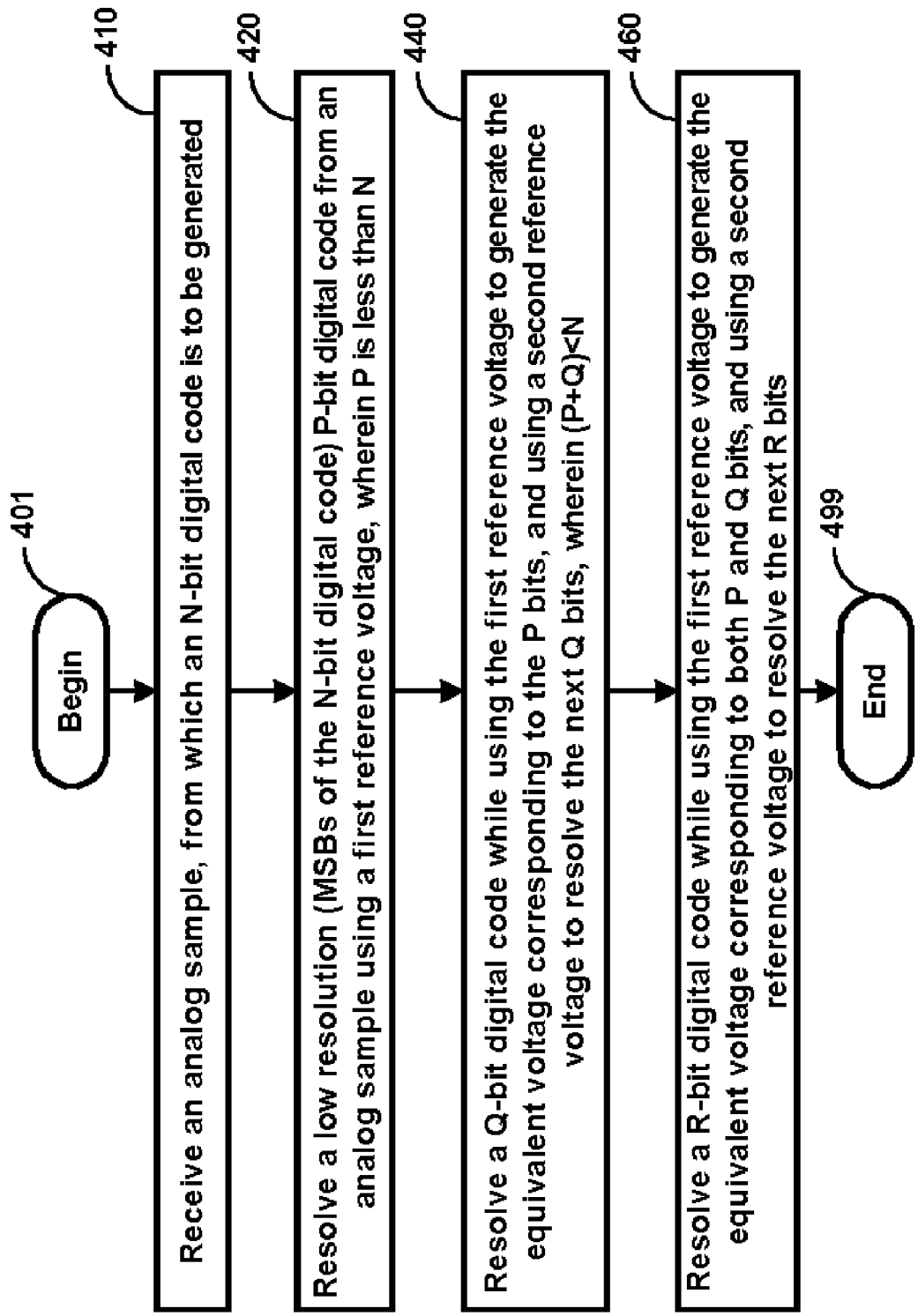
FIG. 4 is a flow chart illustrating the manner in which the accuracy of a digital code may be improved at the output of a high speed SAR ADC according to an aspect of the present invention.

FIG. 4 is a flowchart illustrating the manner in which multiple reference voltages may be used to resolve N-bit digital code corresponding to a sample of an analog signal according to an aspect of the present invention. The method is described with reference to FIG. 3. The method begins in step 401, in which control immediately passes to step 410.

In step 410, DAC 330 receives an analog sample, from which an N_bit digital code is sought to be generated. DAC 330 may sample and store the voltage level of the analog sample.

In step 420, DAC 330 generates P MSBs (P-bit digital code) of the N-bit digital code from the analog sample using one of the two reference voltages (e.g., first reference voltage), wherein P is less than N, and P and N are integers. To generate an accurate N-bit digital code, the first reference voltage needs to be at least P-bit accurate (that is, the first reference voltage should not deviate by more than $\frac{1}{2}^P$ fraction of the desired Vref voltage).

In step 440, DAC 330 then generates the next Q bits (Q_bit digital code) of the N-bit digital code while using the first reference voltage to generate the equivalent voltage (which considers the weight of the bit positions as well as bit values) corresponding to the P bits, and using a second reference voltage to resolve the next Q bits, wherein (P+Q) <N. The second reference voltage needs to be at least Q-bit accurate to generate an accurate N-bit digital code.

In step 460, DAC 330 generates the next R bits (R_bit digital code) while using the first reference voltage to generate the equivalent voltage corresponding to both P and Q bits, and using a second reference voltage to resolve the next R bits. Step 460 is repeated until all the bits in N-bit digital code are resolved. The method ends in step 499.

Thus, one of the buffers is used to provide the reference voltage to (portions of the circuit corresponding to) the previously resolved bits and another buffer is used to provide another reference voltage to the bits presently being resolved. The manner in which such an approach may generate accurate digital codes even if the two reference voltages are not substantially equal, is described below with reference to details of DAC 330 in one embodiment.

7. DAC

Figure 5:
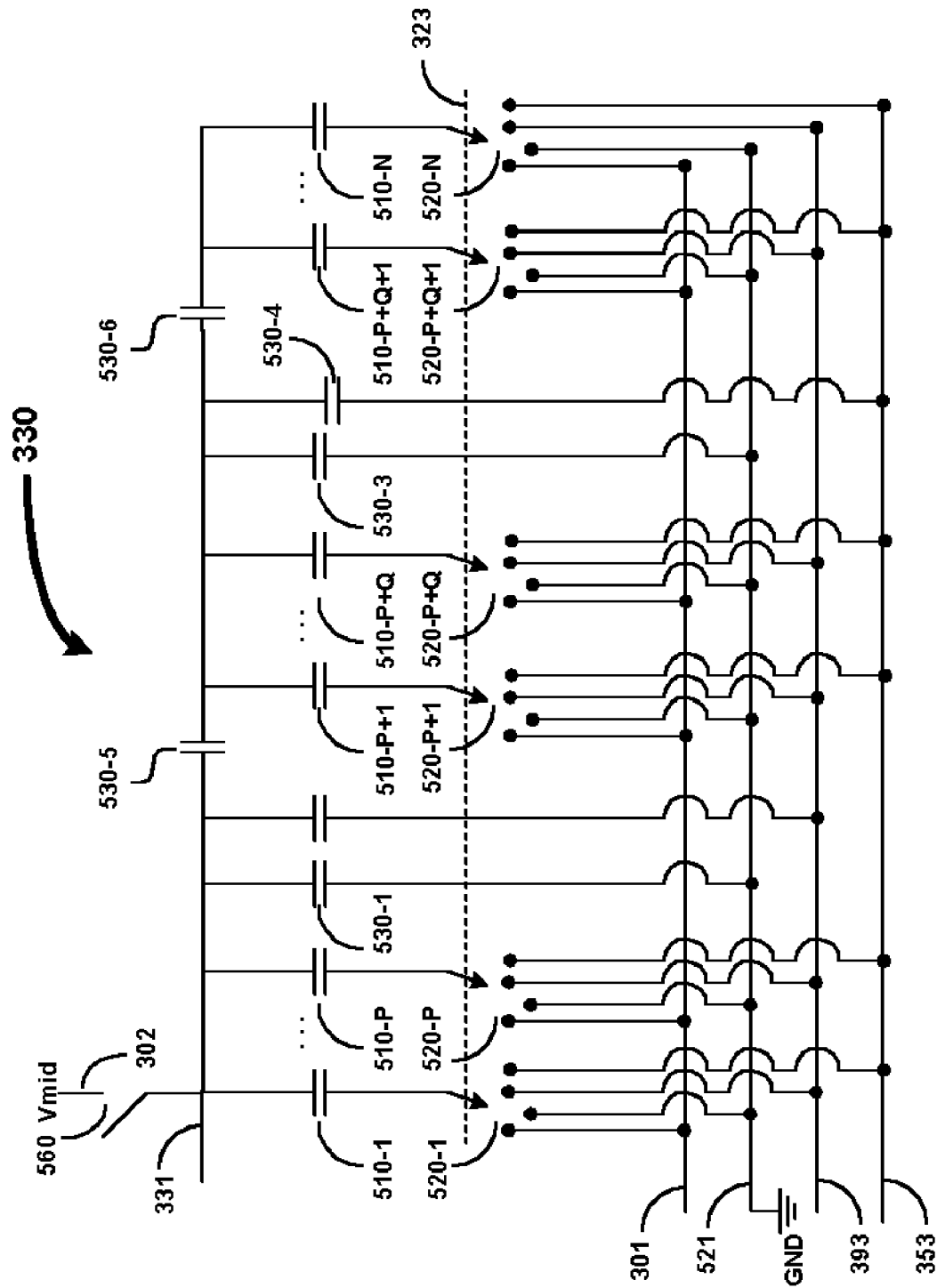
FIG. 5 is a circuit diagram illustrating the details of a DAC according to an aspect of the present invention.

FIG. 5 is a circuit diagram illustrating the details of DAC 330 in an embodiment of the present invention. For conciseness, DAC 330 is described in comparison to FIGS. 2A and 2B. DAC 330 is shown containing capacitors 510-1 through 510-N and 530-1 through 530-6, and switches 520-1 through 520-N and 560. The operation of each component is described in further detail below.

Capacitors 510-1 through 510-N, and 530-1 through 530-6, and switches 520-1 through 520-N and 560 may be operated similar to capacitors 210-1 through 210-N, and 230-1 through 230-6, and switches 220-1 through 220-N and 260 respectively as in FIGS. 2A and 2B to determine a N-bit digital code. However, in comparison to switches 220-1 through 220-N (which contain only three connection points), each of switches 520-1 through 520-N contains one more connection point. The additional connection point enables a second reference voltage to be received (to connect to corresponding capacitor) according to several aspects of the present invention, as described below.

As described above, DAC 330 receives an analog sample on path 301 in a sampling phase, in which switches 520-1 through 520-N are connected to path 301. DAC 330 converts the analog sample into an N-bit digital code in the conversion phase. For illustration, the N-bit digital code is assumed to be divided into (P+Q+R) bits, each of which is potentially generated at different speeds to provide the final N-bit digital code at a high speed. The speed of resolving each of P, Q and R bits is controlled by a clock signal received on path 322 of FIG. 3. The manner in which reference voltages on paths 393 and 353 are connected to resolve the bits is described below.

Reference voltage 393 is used to resolve the first P-bits (MSBs of N-bit digital code). Switches 520-1 through 520-P are controlled by the P-bits in the intermediate digital value received on path 323 to connect each of capacitors 510-1 through 510-P to either Vref 393 or ground (depending on whether the corresponding bit is 0 or 1). All the remaining capacitors 510-P+1 through 510-N are connected to ground or Vref 393 according to the corresponding bits in intermediate digital value 323 by the corresponding switches 520-P+1 through 520-N. The P-bits may be resolved in P-iterations by the appropriate operation of comparator 310 and SAR logic 320. Capacitors 530-1 and 530-2 operate to correct the error in the resolved P-bits in the (P+1) iteration similar to capacitors 230-1 and 230-2.

Continuing with resolving the N-bits, once all the P-bits are resolved, the next Q-bits are resolved by using both reference voltages 393 and 353. Reference voltage 393 is used to provide the required reference voltage to capacitors 510-1 through 510-P. Each capacitor 510-1 through 510-P is connected to either Vref 393 or ground according to the corresponding resolved bit value.

That is, when the P MSBs are resolved first, switches 520-1 through 520-P are used to connect corresponding capacitors 510-1 through 510-P to Vref 393 (or ground, depending on the corresponding bit in the intermediate digital value). On the other hand, when the remaining (N−P) are resolves, switches 520-1 through 520-P are used to connect corresponding capacitors 510-1 through 510-P to Vref 353 (or ground). The remaining capacitors 510-P+1 through 510-N may also be operated similarly (i.e., connected to Vref 393 while corresponding bits are being resolved and then to Vref 353 after resolution).

Reference voltage 353 provides the reference voltage to capacitors 510-P+1 through 510-P+Q (while the Q bits are being resolved). Each capacitor 510-P+1 through 510-P+Q is connected to either Vref 353 or ground by operating corresponding one of switches 520-P+1 through 520-P+Q based on the corresponding one of the bits of the intermediate digital value 323. The Q-bits are thus resolved in Q-iterations by the appropriate operation of comparator 310 and SAR logic 320.

Capacitors 530-3 and 530-4 operate to correct the error in the resolved (P+Q)-bits in Q+1 iteration similar to capacitors 230-3 and 230-4. Even though, capacitor 530-4 is shown connected to Vref 353, each of capacitors 530-3 and 530-4 is either connected to Vref 393 or ground after Q+1 iteration based on the result of error correction.

Similarly, the remaining R-bits are also resolved by using the two reference voltages 393 and 353. In particular, the required reference voltage to capacitors 510-1 through 510-P+Q is provided using Vref 393 and to capacitors 510-P+Q+1 through 510-N using reference voltage 353.

It may be noted that reference voltage 393 needs to be of P-bit accuracy (deviation by less than $\frac{1}{2}^P$ of the desired reference voltage) while resolving the P-bits. If P is small, for example 6, then 6-bit accuracy can easily be achieved. Similarly, reference voltage 353 needs to be only Q-bit accurate while resolving Q-bits. Even though, reference voltage 353 needs to be only Q-bit accurate, intermediate voltage on path 331 is provided with (P+Q) bit accuracy while resolving Q-bits since any variation in reference voltage 353 is divided by the capacitance of series capacitor 530-5. As a result, the accuracy and the difference between reference voltage generated by buffers 390 and 350 may also be reduced (which may otherwise require (N−P) bit accuracy in prior DAC of FIG. 2B). When the accuracy requirements are reduced, low power buffers may be advantageously used to generate the reference voltages.

In addition, the approach of above may generate accurate N-bit digital codes even if the two reference voltages are not substantially equal. Such an accuracy is achieved since a single reference voltage is used to generate the intermediate analog signal (from the intermediate digital value) corresponding to the resolved bits. In addition, the error correction techniques (such as that described above) correct any deviations that may have been caused due to a different voltage level being present on the other reference voltage.

In addition, the load on buffer 390 due to capacitors in DAC 330 may not affect the reference voltage on path 393 since Vref 393 is connected to the capacitors corresponding to the resolved bits, which do not switch their connections. As a result of constant load on buffer 390, reference voltage 393 may not change much.

Similarly, the capacitance load on buffer 350 due to the capacitors corresponding to the bits presently being resolved is small, since buffer 350 is used to resolve only a few bits of the N-bit digital code. However, a change in capacitance load may (at least transiently) decrease the voltage level of Vref 353 and cause inaccuracy in the N-bit digital code. Such inaccuracy may be corrected using error correction as described above.

Therefore, an accurate N-bit digital code may be generated corresponding to a sample of an analog signal by using one reference voltage to provide the voltage to the capacitors corresponding to the resolved bits and another reference voltage to provide the required voltage to the capacitors corresponding to the bits presently being resolved in the N-bit digital code.

In the design of high speed SAR ADCs, it may be required to provide a high signal to noise ratio (SNR) as well as high throughput performance. As noted above, SNR generally refers to the ability of an ADC to generate a digital code accurately independent of any noise that may otherwise affect the accuracy. It may be appreciated that SNR of SAR ADCs can be increased by using capacitors with a large capacitance value. However, an increase in capacitance value of capacitors used in a DAC of a SAR ADC may lead to reduction in throughput performance since large capacitors may need more time to settle to the correct value. The manner in which SNR may be increased while providing a digital code at a high speed according to an aspect of the present invention is described below with examples.

8. Method of Increasing SNR of a Digital Code While Maintaining High Speed

Figure 6:
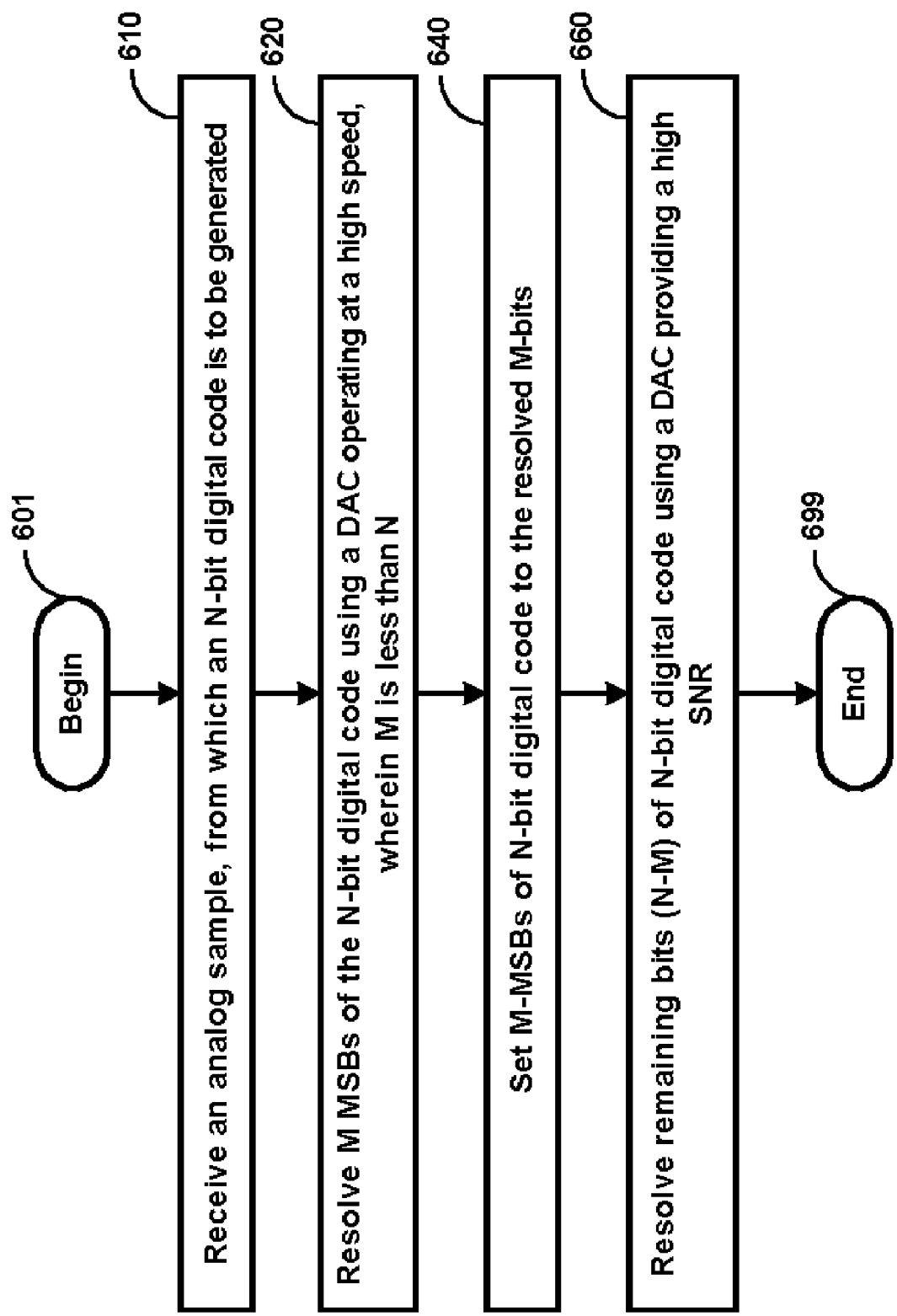
FIG. 6 is a flow chart illustrating the manner in which a ADC may be implemented with high throughput performance and high SNR according to an aspect of the present invention.

FIG. 6 is a flowchart illustrating a manner in which signal to noise ratio (SNR) (and accuracy) of a SAR ADC may be increased while maintaining high speed (throughput performance) in an embodiment of the present invention. The method is described with reference to FIGS. 3 and 5 for illustration. The method begins in step 601, in which control immediately passes to step 610.

In step 610, an analog sample is received, from which an N-bit digital code (N being an integer) is to be generated. Each of a high SNR DAC and a high speed DAC (described in steps below) samples and stores the voltage level of the analog sample.

In step 620, M MSBs of the N_bit digital code are resolved using a DAC operating at a high speed, wherein M is an integer less than N. In an embodiment, high speed DAC is implemented using small (absolute) capacitance values for the capacitors in the DACs, while maintaining the same capacitance values consistent with the design requirements of SAR principles. Small value capacitors generally settle to the final/correct voltage quickly and thus the speed may be increased. The short settling times facilitate accurate determination of the M-bits in a short duration.

In step 640, M_MSBs of N_bit digital code are set to the M_bits resolved in step 620. In step 660, remaining bits (N_M) of N_bit digital code are resolved using a DAC providing a high SNR, but starting with the M-MSBs set in step 640 as the intermediate digital value. As noted above, high SNR may be achieved by using large capacitance capacitors in a DAC (but with relative ratios being consistent with a SAR implementation). Due to the use of the high SNR DAC, the N-bit digital code may be generated with a high SNR. The method ends in step 699.

Thus, by using a high speed DAC to resolve the MSBs, the throughput performance is enhanced, and by using a high SNR DAC to resolve the remaining bits, high SNR is attained. The description is continued with reference to an example embodiment implementing at least some of the features described above.

9. High SNR SAR ADC Providing Accurate Digital Code at a High Speed

Figure 7:
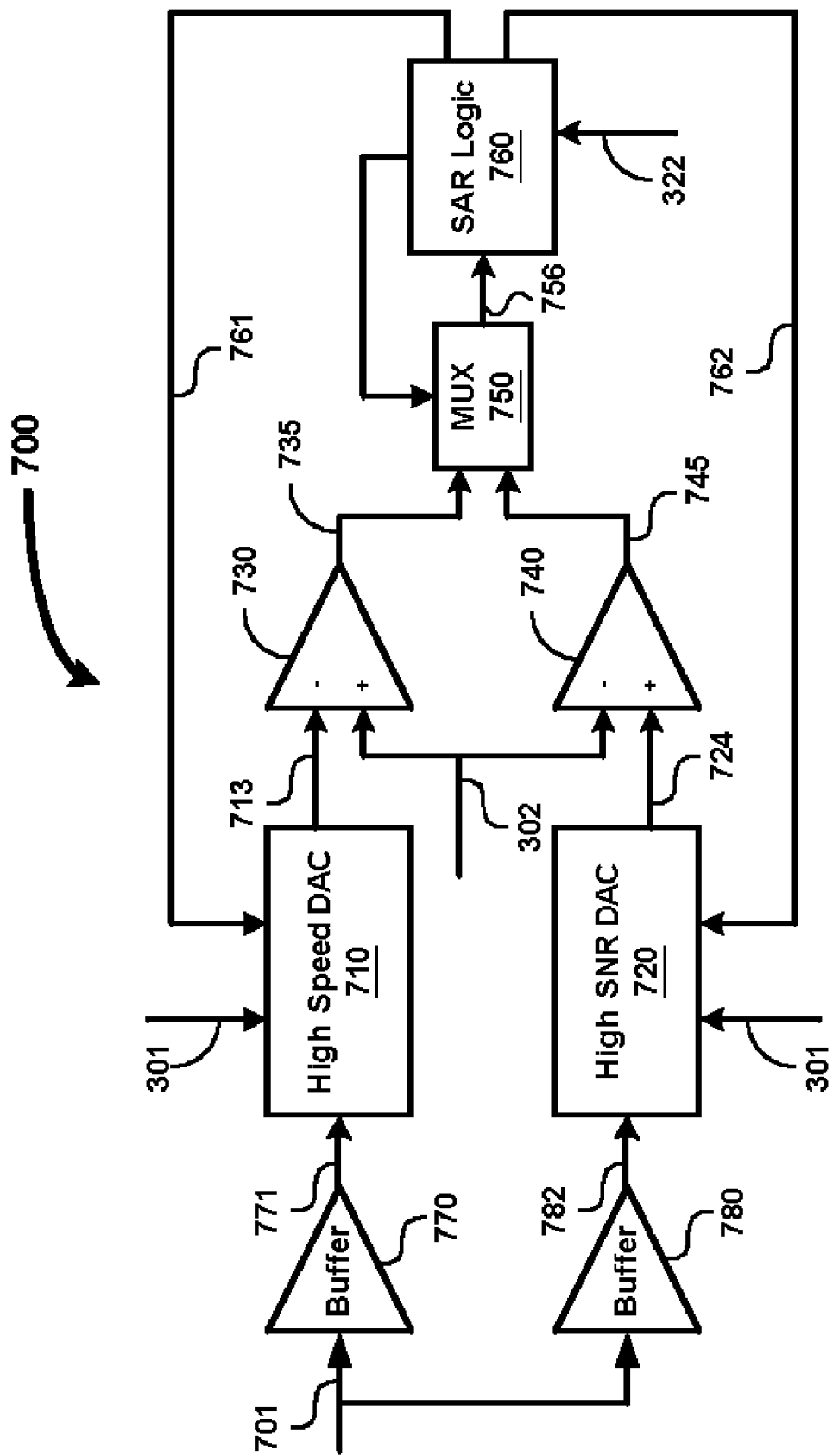
FIG. 7 is a block diagram illustrating the details of a SAR ADC providing high SNR and high throughput performance in an embodiment of the present invention.

FIG. 7 is a block diagram illustrating the details of a SAR ADC providing high SNR and generating digital codes at a high speed in an embodiment of the present invention. SAR ADC 700 is described with reference to FIG. 3 for illustration. SAR ADC 700 is shown containing high speed DAC 710, high SNR DAC 720, comparators 730 and 740, multiplexer 750, SAR logic 760, and buffers 770 and 780. Each component is described below in detail.

Buffers 770 and 780 generate reference voltages 771 and 782 from an external voltage received on path 701. Buffers 770 and 780 can be implemented in a known way.

High speed DAC 710 samples the analog signal received on path 301 in a sampling phase before the first iteration during conversion. DAC 710 generates an intermediate voltage (similar to the voltage level of path 131 of FIG. 1) on path 713 from the intermediate digital value received on path 761. Intermediate voltage 713 is generated using a reference voltage received on path 771. DAC 710 may be implemented similar to DAC 130 (or only a portion corresponding to the M-bits), but using low capacitance value capacitors (compared to in DAC 720). DAC 710 generates intermediate voltage 713 accurately since capacitors with low capacitance value settle to reference voltage 771 quickly in the desired time duration (a clock cycle at high speed).

High SNR DAC 720 also samples the analog signal received on path 301 in a sampling phase before the first iteration during conversion. DAC 720 generates an intermediate voltage on path 724 from the N-bit intermediate digital value received on path 762 and a reference voltage received on path 782 when the (N−M) least significant bits (LSBs) are being resolved. In an embodiment, DAC 720 is also implemented similar to DAC 130, but using high capacitance value capacitors (compared to in DAC 710). such an embodiment, DAC 720 may be provided the N-bit digital values (from SAR logic 760) even when the M MSBs are resolved, which provides the capacitors additional time to settle to the respective final voltages.

Comparator 730 compares an intermediate analog signal received on path 713 with a voltage level (Vmid equaling Vdd/2 in an example embodiment) on path 302, and provides the result of the comparison (iteration status) on path 735. Comparator 740 operates similarly except that input signal on path 724 is compared with Vmid 302, and output is generated on path 745.

Multiplexer (mux) 750 selects one of the results received on paths 735 and 745 under the control of SAR logic 760. The comparison result on path 735 is selected while determining the first M-bits, and comparison result on path 745 is selected while determining the remaining (N−M) bits. Mux 750 provides the selected comparison result on path 756.

SAR logic 760 determines the N-bit digital code corresponding to a sample (provided on path 301) using successive approximation principle by interfacing with mux 750, and DACs 710 and 720. In general, SAR logic 760 sends an intermediate digital value during each iteration to determine a bit. Clock 322 controls the duration of each iteration.

As described above, only a M-bit value may need to be sent on path 761 while resolving the first M-bits. A N-bit value may be sent on path 762 at least while resolving the remaining (N−M) bits. SAR logic 760 may control the operation of mux 750 to cause the input value on path 735 to be selected while resolving first M-bits and the input value on path 745 to be selected while resolving the remaining bits of N-bit digital code.

It may be noted from the above that high SNR is obtained due to the use of high SNR DAC and high throughput performance is obtained due to the use of high speed DAC. As a result, high speed SAR ADC providing high SNR may be implemented according to several aspects of the present invention.

One problem with (an embodiment of) high SNR DAC of 720 is that large capacitance may reduce the voltage level of reference voltage 782 and causes an inaccuracy in the N-bit digital code. The accuracy may be increased using techniques described above with reference to FIG. 3. Alternative embodiments implemented accordingly are described below with reference to FIG. 8.

10. Alternative Embodiment

Figure 8:
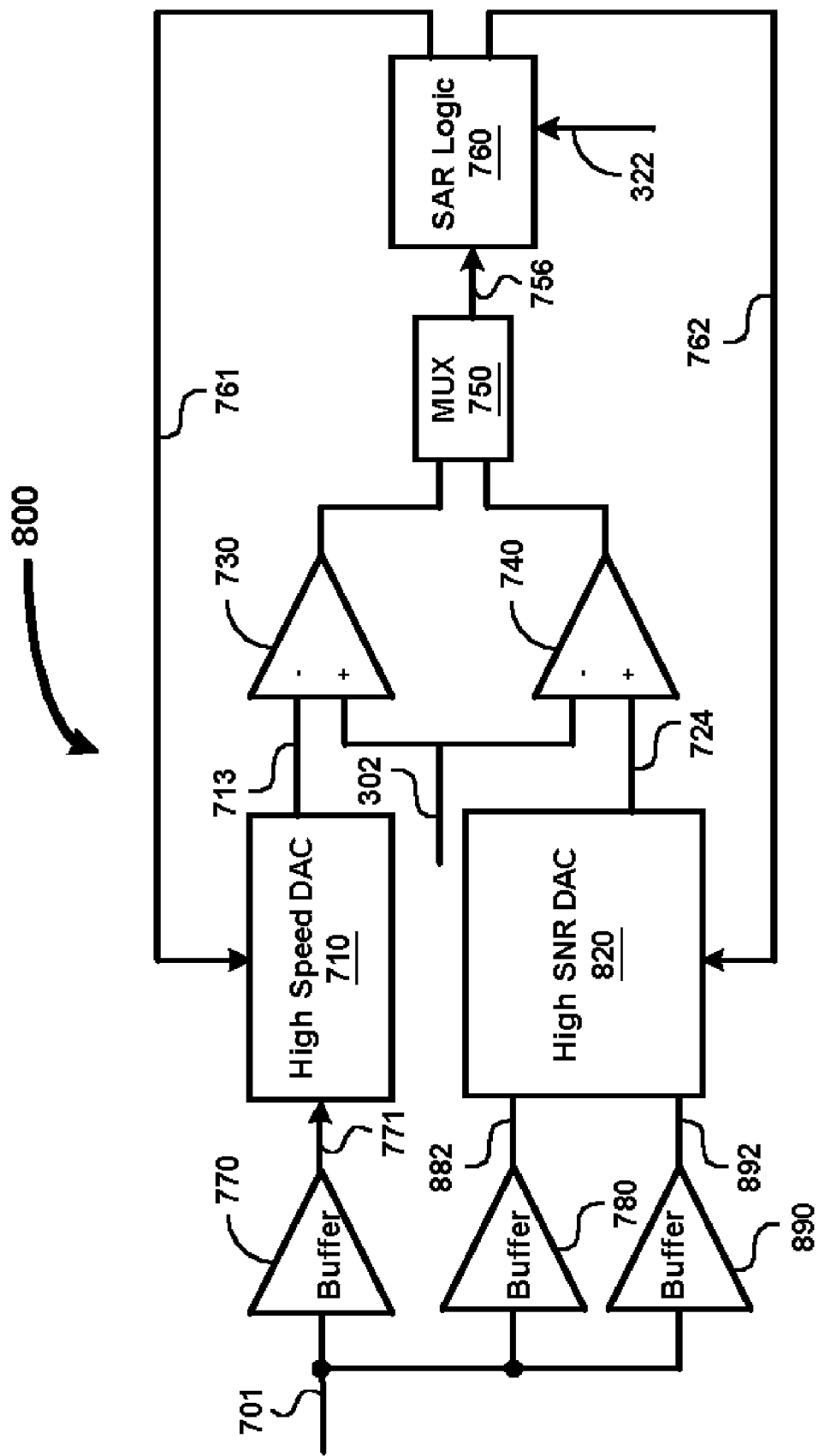
FIG. 8 is a block diagram illustrating the manner in which the accuracy of digital codes generated by the embodiment of FIG. 7 can be improved in an embodiment of the present invention.

FIG. 8 is a block diagram illustrating the details of a SAR ADC further improving accuracy of a digital code in an alternative embodiment of the present invention. SAR ADC 800 is described with reference to FIGS. 3 and 7 for illustration. SAR ADC 800 is shown containing high speed DAC 710, high SNR DAC 820, comparators 730 and 740, multiplexer 750, SAR logic 760, and buffers 770, 780 and 890. Merely for conciseness, the components introduced in FIG. 7 are not described again. All the remaining components are described below in detail.

High SNR DAC 820 operates similar to DAC 330 of FIG. 3, but with buffers 780 and 890 providing the two reference signals. Due to the use of two reference voltages on paths 882 and 892 similar to reference voltages 393 and 353 respectively, the inaccuracy due to error in intermediate voltage 724 may be reduced. In addition, due to the use of high speed DAC to resolve the MSBs, the inaccuracy due to settling of the capacitors corresponding to MSBs in DAC 20 may be reduced. Therefore, SAR ADC 800 provides an accurate digital code at a high speed.

The approaches described above can be implemented in various systems. The description is continued with reference to an example system in which several aspects of the present invention can be implemented.

11. Example System

Figure 9:
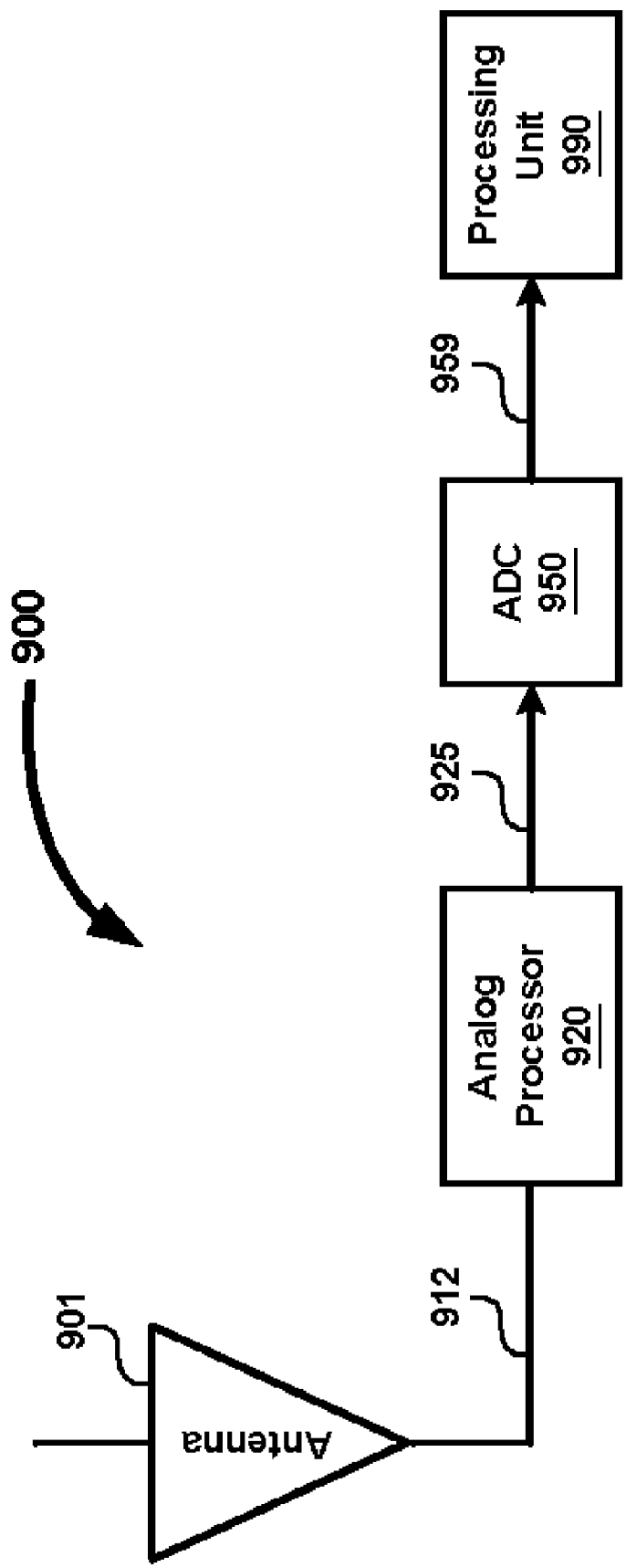
FIG. 9 is a block diagram illustrating an example system in which the present invention can be implemented.

FIG. 9 is a block diagram of receiver system 900 illustrating an example system in which the present invention may be implemented. For illustration, it is assumed that receiver system 900 corresponds to a Global Positioning System (GPS) receiver. However, several aspects of the present invention can be implemented in other communication systems (e.g., mobile phone, etc.). Receiver system 900 is shown containing antenna 901, analog processor 920, ADC 950, and processing unit 990. Each component is described in further detail below.

Antenna 901 may receive various signals transmitted from satellites, etc. The received signals may be provided to analog processor 920 on path 912 for further processing. Analog processor 920 may perform tasks such as amplification (or attenuation as desired), filtering, frequency conversion, etc., on received signals and provides the resulting signal on path 925. The processed signal may be provided to ADC 950 on path 925.

ADC 950 converts the analog signal received on path 925 to a corresponding digital value based on SAP. The digital value may be provided to processing unit 990 on path 959 for further processing. ADC 950 may be implemented in a similar manner to ADC 300 of FIG. 3 or ADC 700 of FIG. 7. In alternative embodiment, ADC 950 may be implemented in a similar manner to ADC 800 of FIG. 8. Processing unit 990 receives the recovered data to provide various user applications (such as telephone calls, data applications).

Thus, several aspects of the present invention described above can be used to provide a high speed successive approximation type analog to digital converters with accurate digital code while increasing SNR.

In addition, various modifications can be made to the embodiments/approaches described above without departing from the scope and spirit of several aspects of the present invention. For example, the DACs are shown implemented using capacitors, however, the DACs can be implemented in several other ways as is well known in relevant arts.

Similarly, even though the description of above is provided with reference to single-ended circuits, the approaches described above can be extended to differential circuits, as will be apparent to one skilled in the relevant arts by reading the disclosure provided herein.

12. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of converting a sample of an analog signal to a N-bit digital code, said method being performed in an analog to digital converter (ADC), said method comprising:

receiving said sample of said analog signal;

resolving P most significant bits (MSBs) of said N-bit digital code from said sample using one of a first reference voltage and a second reference voltage, wherein P is less than N; and resolving Q bits of said N-bit digital code while using said first reference voltage to generate an equivalent voltage corresponding to said P MSBs and using said second reference voltage to generate an equivalent voltage corresponding to said Q bits, wherein said Q bits form the next MSBs following said P MSBs, further comprising resolving next R bits of said N-bit digital code while using said first reference voltage to generate an equivalent voltage corresponding to both of said P MSBs and said Q bits, and said second reference voltage to generate an equivalent voltage corresponding to said R bits.

2. A method of converting a sample of an analog signal to a N-bit digital code, said method being performed in an analog to digital converter (ADC), said method comprising:

receiving said sample of said analog signal;

resolving P most significant bits (MSBs) of said N-bit digital code from said sample using one of a first reference voltage and a second reference voltage, wherein P is less than N; and resolving Q bits of said N-bit digital code while using said first reference voltage to generate an equivalent voltage corresponding to said P MSBs and using said second reference voltage to generate an equivalent voltage corresponding to said Q bits, wherein said Q bits form the next MSBs following said P MSBs, further comprises generating said first reference voltage using a first buffer and said second reference voltage using a second buffer.

3. The method of claim 2, wherein the voltage level of said first reference voltage equals the voltage level of said second reference voltage.

4. The method of claim 3, wherein said ADC comprises N capacitors operated according to successive approximation principle (SAP), wherein said N capacitors comprise P capacitors to resolve said P MSBs and Q capacitors to resolve said Q bits, wherein said resolving P MSBs comprises:

sampling said sample on said N capacitors in a sampling phase; and connecting each of said P capacitors to said first reference voltage or ground based on a corresponding bit of said N_bit digital code in each iteration.

5. The method of claim 4, wherein said resolving Q bits comprises connecting each of said Q capacitors to said second reference voltage or ground based on a corresponding bit of said N_bit digital code in each iteration, wherein each of said Q capacitors are connected to said first reference voltage or ground after resolving said Q bits based on a corresponding bit of said N_bit digital code in each iteration.

6. The method of claim 5, further comprises correcting an error in said P MSBs, said correcting comprises:
   connecting a first capacitor to a ground before completing resolving of said P MSBs;
   connecting a second capacitor to said first reference voltage before completing resolving of said P MSBs, wherein said first capacitor and said second capacitor are provided for said correcting; and
   connecting said first capacitor to said first reference voltage if a voltage representing said P MSBs is less than a voltage level of said sample after resolving of said P MSBs, else connecting said second capacitor to ground.

7. The method of claim 6, further comprises correcting an error in said Q bits, wherein said correcting said error in said Q bits comprises:
   connecting a third capacitor to a ground before completing resolving of said Q bits;
   connecting a fourth capacitor to said second reference voltage before completing resolving of said Q bits, wherein said third capacitor and fourth capacitor are provided for said correcting said error in said Q bits; and
   connecting said third capacitor to said first reference voltage if a voltage representing said P MSBs and said Q bits is less than said voltage level of said sample after resolving of said Q bits, else connecting said fourth capacitor to ground.

8. A method of converting a sample of an analog signal to a N-bit digital code, said method being performed in an analog to digital converter (ADC), said method comprising:
   receiving said sample;
   resolving at least one most significant bits (MSB) of said N-bit digital code using a first DAC;
   setting an intermediate digital value to equal said at least one MSB in corresponding bit positions; and
   resolving at least one of the remaining bits of said MSB using a second DAC starting from said intermediate digital value,
   wherein each of said at least one MSB and at least one of the remaining bits are resolved according to a successive approximation principle (SAP).

9. The method of claim 8, wherein said at least one MSB comprise M most significant bits (MSBs) of said N-bit digital code, wherein said at least one of the remaining bits comprise remaining (N−M bits) of said N-bit digital code.

10. The method of claim 9, wherein said first DAC is implemented with a higher speed compared to said second DAC, and said second DAC is implemented with a higher SNR compared to said first DAC such that said ADC is provided with high speed and high SNR.

11. The method of claim 10, wherein said first DAC comprises a first plurality of capacitors and said second DAC comprises a second plurality of capacitors, wherein a capacitance value of each of said second plurality of capacitors is greater than the capacitance value of a corresponding one of said first plurality of capacitors.

12. The method of claim 11, further comprises:
   providing a first reference voltage and a second reference voltage to said second DAC, wherein said first reference voltage and said second reference voltage are generated by a first buffer and a second buffer respectively.

13. A successive approximation type analog to digital converter (SAR ADC) converting a sample of an input analog signal into an N-bit digital code, said SAR ADC comprising:
   a SAR logic determining said N-bit digital code, said SAR logic providing an intermediate digital value in each iteration according to a comparison result which is based on a comparison of a voltage level equivalent of the intermediate digital value provided in a prior iteration with said sample;
   a comparator providing said comparison result; and
   a digital to analog converter (DAC) converting said intermediate value to an equivalent voltage level, said DAC receiving a first reference voltage and a second reference voltage, wherein said DAC generates said voltage level using said first reference voltage for a first subset of bits and said second reference voltage for a second subset of bits, wherein said first subset of bits and said second subset of bits are contained in said intermediate digital value.

14. The SAR ADC of claim 13, wherein said voltage level represents a sum of a first voltage portion and a second voltage portion, wherein said first voltage portion represents an equivalent voltage corresponding to said first subset of bits and said second voltage portion represents an equivalent voltage corresponding to said second subset of bits.

15. The SAR ADC of claim 14, wherein said first subset of bits comprise P most significant bits (MSBs) resolved in prior iterations, and said second subset of bits comprise Q bits following said P MSBs, wherein said Q bits are presently being resolved by said SAR ADC.

16. The SAR ADC of claim 15, wherein an equivalent voltage corresponding to both of said P MSBs and said Q bits is generated using said first reference voltage in a subsequent iteration.

17. The SAR ADC of claim 16, further comprising a first reference buffer providing said first reference voltage and a second reference buffer providing said second reference voltage.

18. The SAR ADC of claim 16, wherein said DAC receives said sample and generates (a second input voltage−voltage of said sample+equivalent voltage of said intermediate digital value) as an input to said comparator, wherein '−' represents a subtraction operation and said second input voltage is also provided as an input to said comparator.

19. The SAR ADC of claim 16, wherein said DAC generates an equivalent voltage corresponding to a next R bits of said N-bit digital code using said second reference voltage.

20. The SAR ADC of claim 19, wherein the voltage level of said first reference voltage equals the voltage level of said second reference voltage.

21. The SAR ADC of claim 19, wherein said DAC comprises N capacitors, wherein said N capacitors comprise P capacitors to resolve said P MSBs and Q capacitors to resolve said Q bits, wherein said N capacitors are connected to said sample in a sampling phase, and wherein each of said Q capacitors is connected to said second reference voltage or ground based on a corresponding bit of said N_bit digital code in said present iteration and to said first reference voltage or ground based on a corresponding bit of said N-bit digital code in said subsequent iteration.

22. The SAR ADC of claim 21, further comprises a correction circuit correcting an error in said P MSBs, said correction circuit comprises:
   a first capacitor connected to a ground before completing resolving of said P MSBs; and
   a second capacitor connected to said first reference voltage before completing resolving of said P MSBs,
   wherein said first capacitor is connected to said first reference voltage if a voltage representing said P MSBs is less than a voltage level of said sample after resolving of said P MSBs, else said second capacitor is connected to ground.

23. A successive approximation type analog to digital converter (SAR ADC) converting a sample of an input analog signal into an N-bit digital code, said SAR ADC comprising:
   a first digital to analog converter (DAC) converting a first input to an equivalent voltage level;
   a second digital to analog converter (DAC) converting a second input to an equivalent voltage level wherein said second input comprises N-bits; and
   a SAR logic sending a first sequence of input bit sets as said first input and determining a corresponding number of most significant bit (MSB) values, wherein each of said first sequence of input bit sets contains a number of bits equaling a number of bits in said first input, said SAR logic setting corresponding MSB positions of an intermediate digital value to the determined MSB values and sending said intermediate digital value as said second input to determine another bit of said N-bit digital code.

24. The SAR ADC of claim 23, further comprising
   a first comparator providing a first comparison result which is based on a comparison of said equivalent voltage of said first input with said sample;
   a second comparator providing a second comparison result which is based on a comparison of said equivalent voltage of said second input with said sample; and
   a multiplexor sending providing said first comparison result as an output when said SAR logic sends said first sequence of input bit sets as said first input, and said second comparison result as said output when said SAR logic sends said intermediate digital value as said second input, wherein said SAR logic determines each bit of said N-bit digital code according to said output.

25. The SAR ADC of claim 23, wherein said first DAC is implemented with a higher speed compared to said second DAC, and said second DAC is implemented with a higher SNR compared to said first DAC such that said ADC is provided with high speed and high SNR.

26. The SAR ADC of claim 25, wherein said first DAC comprises a first plurality of capacitors and said second DAC comprises a second plurality of capacitors, wherein a capacitance value of each of said second plurality of capacitors is greater than the capacitance value of a corresponding one of said first plurality of capacitors.

27. The SAR ADC of claim 26, further comprises:
   a first buffer and a second buffer, wherein said first buffer and said second buffer respectively provides a first reference voltage and a second reference voltage to said second DAC.

28. A system comprising:
   an analog processor processing an analog signal to generate a sample of an analog signal;
   a successive approximation digital to analog converter (SAR ADC) converting said sample into an N-bit digital code, said SAR ADC comprising:
   a SAR logic determining said N-bit digital code, said SAR logic providing an intermediate digital value in each iteration according to a comparison result which is based on a comparison of a voltage level equivalent of the intermediate digital value provided in a prior iteration with said sample;
   a comparator providing said comparison result; and
   a digital to analog converter (DAC) converting said intermediate value to an equivalent voltage level, said DAC receiving a first reference voltage and a second reference voltage, wherein said DAC generates said voltage level using said first reference voltage for a first subset of bits and said second reference voltage for a second subset of bits, wherein said first subset of bits and said second subset of bits are contained in said intermediate digital value.

29. The system of claim 28, wherein said voltage level represents a sum of a first voltage portion and a second voltage portion, wherein said first voltage portion represents an equivalent voltage corresponding to said first subset of bits and said second voltage portion represents an equivalent voltage corresponding to said second subset of bits.

30. The system of claim 29, wherein said first subset of bits comprise P most significant bits (MSBs) resolved in prior iterations, and said second subset of bits comprise Q bits following said P MSBs, wherein said Q bits are presently being resolved by said SAR ADC.

31. The system of claim 30, wherein an equivalent voltage corresponding to both of said P MSBs and said Q bits is generated using said first reference voltage in a subsequent iteration.

32. The system of claim 30, further comprising a first reference buffer providing said first reference voltage and a second reference buffer providing said second reference voltage.

33. The system of claim 30, wherein said DAC receives said sample and generates (a second input voltage–voltage of said sample+equivalent voltage of said intermediate digital value) as an input to said comparator, wherein '−' represents a subtraction operation and said second input voltage is also provided as an input to said comparator.

34. The system of claim 30, wherein said DAC generates an equivalent voltage corresponding to a next R bits of said N-bit digital code using said second reference voltage.

35. The system of claim 34, wherein the voltage level of said first reference voltage equals the voltage level of said second reference voltage.

36. The system of claim 35, wherein said DAC comprises N capacitors, wherein said N capacitors comprise P capacitors to resolve said P MSBs and Q capacitors to resolve said Q bits, wherein said N capacitors are connected to said sample in a sampling phase, and wherein each of said Q capacitors is connected to said second reference voltage or ground based on a corresponding bit of said N_bit digital code in said present iteration and to said first reference voltage or ground based on a corresponding bit of said N-bit digital code in said subsequent iteration.

37. The system of claim 36, further comprises a correction circuit correcting an error in said P MSBs, said correction circuit comprises:
- a first capacitor connected to a ground before completing resolving of said P MSBs; and
- a second capacitor connected to said first reference voltage before completing resolving of said P MSBs,
- wherein said first capacitor is connected to said first reference voltage if a voltage representing said P MSBs is less than a voltage level of said sample after resolving of said P MSBs, else said second capacitor is connected to ground.

38. The system of claim 37, wherein said system comprises a global positioning system receiver, said system further comprising an antenna to receive said analog signal and provide said analog signal to said analog processor.

39. A system comprising:
- an analog processor processing an analog signal to generate a sample of an analog signal;
- a successive approximation type analog to digital converter (SAR ADC) converting said sample into an N-bit digital code, said SAR ADC comprising:
    - a first comparator providing a comparison result of a first analog signal and said sample;
    - a second comparator providing a comparison result of a second analog signal and said sample;
    - a first digital to analog converter (DAC) receiving said sample and an intermediate P-bit digital value, said first DAC generating said first analog signal based on said intermediate P-bit digital value in each iteration;
    - a second DAC receiving said sample and an intermediate N-bit digital value, said second DAC generating said second analog signal based on said intermediate N-bit digital value in each iteration; and
    - a SAR logic determining said N-bit digital code by resolving a first subset of bits by interfacing with said first DAC and said first comparator, and then resolving a second subset of bits by interfacing with said second DAC and said second comparator, wherein said first subset of bits and said second subset of bits are used to generate said N-bit digital code.

40. The system of claim 39, wherein said first subset of bits comprise M most significant bits (MSBs) of said N-bit digital code, wherein said second subset comprises remaining (N–M bits) of said N-bit digital code.

41. The system of claim 40, wherein said first DAC is implemented with a higher speed compared to said second DAC, and said second DAC is implemented with a higher SNR compared to said first DAC such that said ADC is provided with high speed and high SNR.

42. The system of claim 41, wherein said first DAC comprises a first plurality of capacitors and said second DAC comprises a second plurality of capacitors, wherein a capacitance value of each of said second plurality of capacitors is greater than the capacitance value of a corresponding one of said first plurality of capacitors.

43. The system of claim 42, further comprises:
- a first buffer and a second buffer, wherein said first buffer and said second buffer respectively provides a first reference voltage and a second reference voltage to said second DAC.

44. An apparatus converting a sample of an analog signal to a N-bit digital code, said apparatus comprising:
- means for receiving said sample of said analog signal;
- means for resolving P most significant bits (MSBs) of said N-bit digital code from said sample using one of a first reference voltage and a second reference voltage, wherein P is less than N; and
- means for resolving Q bits of said N-bit digital code while using said first reference voltage to generate an equivalent voltage corresponding to said P MSBs and using said second reference voltage to generate an equivalent voltage corresponding to said Q bits,
- wherein said Q bits form the next MSBs following said P MSBs,
- further comprises means for resolving next R bits of said N-bit digital code while using said first reference voltage to generate an equivalent voltage corresponding to both of said P MSBs and said Q bits, and said second reference voltage to generate an equivalent voltage corresponding to said R bits.

45. The apparatus of claim 44, further comprises means for generating said first reference voltage using a first buffer and said second reference voltage using a second buffer.

46. The apparatus of claim 45, wherein the voltage level of said first reference voltage equals the voltage level of said second reference voltage.

47. The apparatus of claim 46, further comprises an analog to digital converter (ADC), wherein said ADC comprises N capacitors operated according to successive approximation principle (SAP), wherein said N capacitors comprise P capacitors to resolve said P MSBs and Q capacitors to resolve said Q bits, wherein said means for resolving P MSBs comprises:
- means for sampling said sample on said N capacitors in a sampling phase; and
- means for connecting each of said P capacitors to said first reference voltage or ground based on a corresponding bit of said N_bit digital code in each iteration.

48. The apparatus of claim 47, wherein said resolving Q bits comprises means for connecting each of said Q capacitors to said second reference voltage or ground based on a corresponding bit of said N_bit digital code in each iteration, wherein each of said Q capacitors are connected to said first reference voltage or ground after resolving said Q bits based on a corresponding bit of said N_bit digital code in each iteration.

49. The apparatus of claim 48, further comprises means for correcting an error in said P MSBs, said means for correcting comprises:
- means for connecting a first capacitor to a ground before completing resolving of said P MSBs;
- means for connecting a second capacitor to said first reference voltage before completing resolving of said P MSBs, wherein said first capacitor and said second capacitor are provided for said means for correcting; and
- means for connecting said first capacitor to said first reference voltage if a voltage representing said P MSBs is less than a voltage level of said sample after resolving of said P MSBs, else means for connecting said second capacitor to ground.

50. An apparatus converting a sample of an analog signal to a N-bit digital code, said apparatus comprising:
- means for receiving said sample of a voltage level;
- means for providing said sample of said voltage level as an input to a first digital to analog converter (DAC) to resolve a first subset of bits; and
- means for providing said sample of said voltage level as an input to a second DAC to resolve a second subset of bits, wherein said first subset of bits and said second subset of bits are used to generate said N-bit digital code, wherein said first subset of bits comprise M most significant bits (MSBs) of said N-bit digital code, wherein said second subset comprises remaining (N−M bits) of said N-bit digital code, and wherein said first DAC is implemented with a higher speed compared to said second DAC, and said second DAC is implemented with a higher SNR compared to said first DAC such that said ADC is provided with high speed and high SNR.

51. The apparatus of claim 50, wherein said first DAC comprises a first plurality of capacitors and said second DAC comprises a second plurality of capacitors, wherein a capacitance value of each of said second plurality of capacitors is greater than the capacitance value of a corresponding one of said first plurality of capacitors.

52. The apparatus of claim 51, further comprises:

means for providing a first reference voltage and a second reference voltage to said second DAC, wherein said first reference voltage and said second reference voltage are generated by a first buffer and a second buffer respectively.

* * * * *